United States Patent
Disney et al.

(10) Patent No.: US 7,115,958 B2
(45) Date of Patent: *Oct. 3, 2006

(54) LATERAL POWER MOSFET FOR HIGH SWITCHING SPEEDS

(75) Inventors: Donald Ray Disney, Cupertino, CA (US); Wayne Bryan Grabowski, Los Altos, CA (US)

(73) Assignee: Power Integrations, Inc., San Jose, CA (US)

( * ) Notice: Subject to any disclaimer, the term of this patent is extended or adjusted under 35 U.S.C. 154(b) by 42 days.

This patent is subject to a terminal disclaimer.

(21) Appl. No.: 10/968,659

(22) Filed: Oct. 19, 2004

(65) Prior Publication Data

US 2005/0077583 A1    Apr. 14, 2005

(51) Int. Cl.
*H01L 29/76* (2006.01)
(52) U.S. Cl. ............. 257/401; 257/343; 257/E29.256
(58) Field of Classification Search ........ 257/401–402, 257/341–343, E21.435
See application file for complete search history.

(56) References Cited

U.S. PATENT DOCUMENTS

| | | | |
|---|---|---|---|
| 4,926,243 A | 5/1990 | Nakagawa et al. | |
| 5,326,711 A | 7/1994 | Malhi | |
| 5,939,754 A * | 8/1999 | Hoshi | 257/342 |
| 6,054,752 A | 4/2000 | Hara et al. | |
| 6,069,386 A * | 5/2000 | Jos | 257/343 |
| 6,072,215 A * | 6/2000 | Kawaji et al. | 257/334 |
| 6,084,277 A * | 7/2000 | Disney et al. | 257/401 |
| 6,359,308 B1 | 3/2002 | Hijzen et al. | |
| 6,489,653 B1 * | 12/2002 | Watanabe et al. | 257/343 |
| 6,525,372 B1 | 2/2003 | Baliga | |
| 6,555,883 B1 * | 4/2003 | Disney et al. | 257/401 |
| 6,608,351 B1 * | 8/2003 | Meeuwsen et al. | 257/343 |
| 6,677,641 B1 | 1/2004 | Kocon | |
| 6,683,346 B1 | 1/2004 | Zeng | |
| 6,787,848 B1 | 9/2004 | Ono et al. | |
| 6,798,020 B1 | 9/2004 | Disney | |
| 6,865,093 B1 | 3/2005 | Disney | |

FOREIGN PATENT DOCUMENTS

| | | |
|---|---|---|
| DE | 43 09 764 | 9/1994 |
| EP | 1073 123 A2 | 7/2000 |
| GB | 2 309 336 A | 1/1997 |
| JP | 52-178218 | 1/1978 |
| JP | 56-38867 | 4/1981 |
| JP | 57-10975 | 1/1982 |
| JP | 57-12557 | 1/1982 |
| JP | 57-12558 | 1/1982 |
| JP | 60-64471 A | 4/1985 |
| JP | 3-211771 | 9/1991 |
| JP | 4107877 A | 4/1992 |
| JP | 6-120510 | 4/1994 |
| JP | 6-224426 | 8/1994 |

(Continued)

OTHER PUBLICATIONS

"High Voltage Thin Layer Devices (RESURF Devices)," Apples and Vaes, IEDM Tech Digest, Dec. 3-4-5, 1979, pp. 238-241.

(Continued)

*Primary Examiner*—Thao X. Le
(74) *Attorney, Agent, or Firm*—Burgess & Bereznak, LLP

(57) ABSTRACT

A lateral power metal-oxide-semiconductor field effect transistor (MOSFET) having a gate structure in which the insulated gate is coupled to the gate electrode through contacts at a plurality of locations. The source electrode includes first and second segments. The first segment is interposed between the drain electrode and the gate electrode and acts as a field plate.

13 Claims, 4 Drawing Sheets

FOREIGN PATENT DOCUMENTS

| JP | 9-266311 | 10/1997 |
|---|---|---|
| JP | 2000-12854 | 1/2000 |
| JP | 2002-43562 | 2/2002 |
| WO | WO 97/35346 | 9/1997 |
| WO | WO 99/34449 | 7/1999 |
| WO | WO 00/33385 | 6/2000 |
| WO | WO 02/41402 A2 | 5/2002 |
| WO | WO 02/099909 A1 | 12/2002 |

OTHER PUBLICATIONS

"Realization of High Breakdown Voltage (>700V) in Thin SOI Devices," S. Merchan, et al., Phillips Laboratories North America, 1991 IEEE, pp. 31-35.

Patent Abstract of Japan, Kawasaki, et al., vol. 16, No. 347 (E-1240), JP04-107867, Jul. 27, 1992.

"Theory of Semiconductor Superjunction Devices," Fujihira, Japan Journal of Applied Physics vol. 36, Oct. 1997, pp. 6254-6262.

"Air-Gap Formation During IMD Deposition to Lower Interconnect Capacitance," Shieh, et al., IEEE Electron Device Letters vol. 17 No. 1, Jan. 1998.

Oxide-Bypassed VDMOS (OBVDMOS): An Alternative to Superjunction High-Voltage MOS Power Devices, Liang, et al., IEEE Electron Devices Letters, vol. 22, No. 8, Aug. 8, 2001, pp. 407-409.

"Comparison of High-Voltage Devices for Power Integrated Circuits," Anaman, et al., IEDM 84, pp. 258-261.

"A New Generation of High-Voltage MOSFETs Breaks the Limit Line of Silicon," Debby, et al. Siemens AG, Munchen, Germany, IEDM 98-683—IEDM 98-685.

"High Performance 600V Smart Power Technology Based on Thin Layer Silicon-on-Insulators," Letavic, et al, Phillips Research, 4 pages.

"Modern Semiconductor Device Physics," Sze, et al., John Wiley & Sons, Chapter 4 ("Power Devices"), 1998, pp. 203-206.

"Modeling and Optimisation of Lateral High Voltage IC Devices to Minimize 3-D Effects," Hamza Yilmaz, R&D Engineering, General Electric Co., NC, pp. 290-294.

"Optimization of the Specific On-Resistance of the COOLMOS™," Chen, et al., IEEE Transactions on Electron Devices, vol. 48, No. 2, Feb. 01, pp. 344-348.

"Lateral Unbalanced Super Junction (USJ) / 3D-RESURF for High Breakdown Voltage on SOI," Ng, et al., Apr. 6, 2001, pp. 395-398.

"Static and Dynamic Electricity," William R. Smythe, McGraw hill Book Company, Inc., New York, 1950.

* cited by examiner

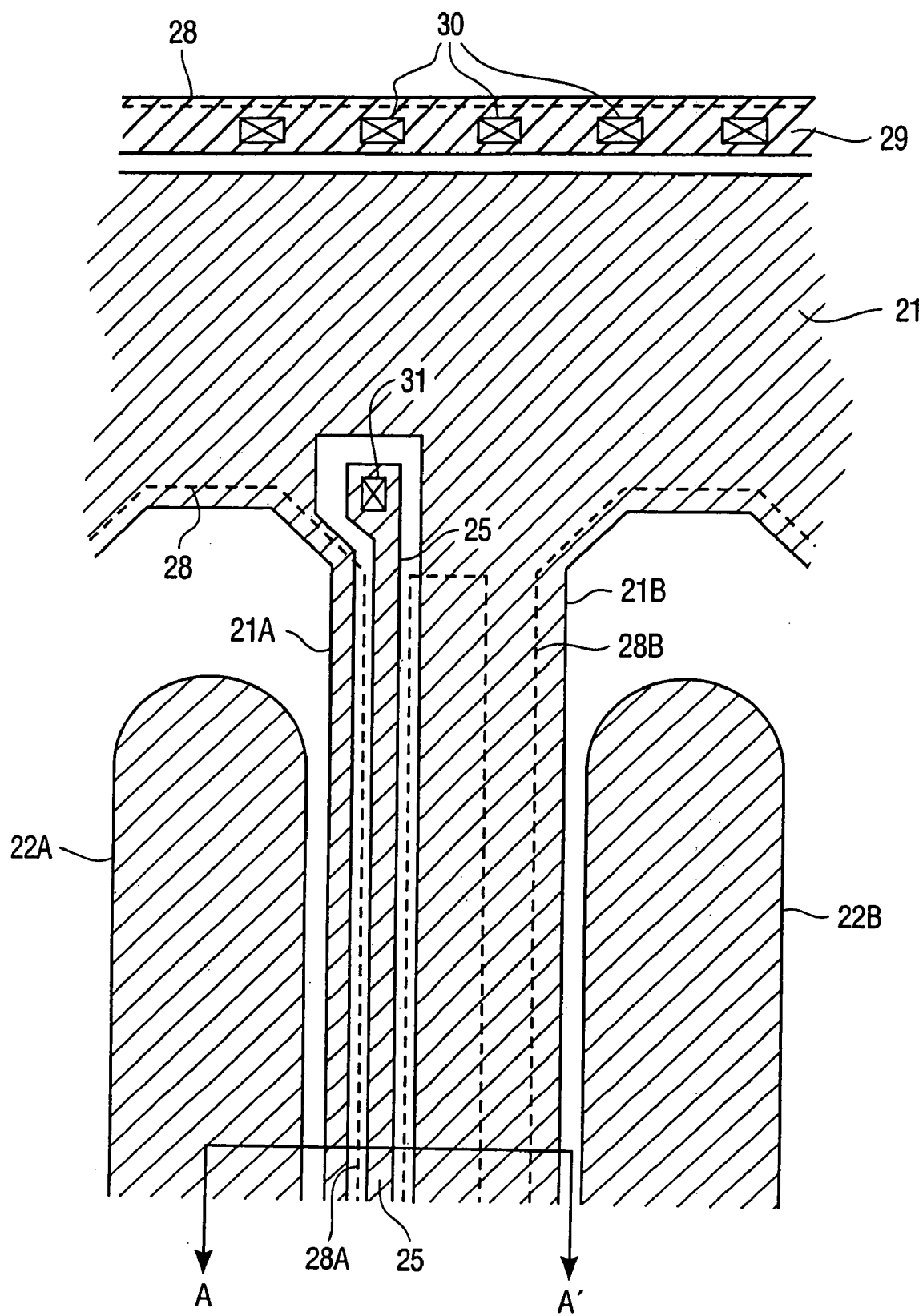
FIG. 1A    FIG. 1B ↓

LATERAL POWER MOSFET FOR HIGH SWITCHING SPEEDS

FIELD OF THE INVENTION

The present invention relates to semiconductor devices fabricated in a silicon substrate. More specifically, the present invention relates to a high voltage field effect transistor with an improved gate design.

BACKGROUND OF THE INVENTION

A common type of integrated circuit device is a metal-oxide-semiconductor field effect transistor (MOSFET). A MOSFET is a field effect device that includes a source region, a drain region, a channel region extending between the source and drain regions, and a gate provided over the channel region. The gate includes a conductive gate structure disposed over and separated from the channel region with a thin oxide layer.

Lateral field-effect transistors are widely used for high voltage circuit applications, e.g., greater than 200 volts. Examples of traditional lateral MOSFET device structures for power applications include U.S. Pat. Nos. 5,869,875, 5,821,144, 5,760,440, and 4,748,936. Each of these devices has a source region and a drain region separated by an intermediate region. A gate structure is disposed over a thin oxide layer over the metal-oxide-semiconductor (MOS) channel of the device. In the on state, a voltage is applied to the gate to cause a conduction channel to form between the source and drain regions, thereby allowing current to flow through the device. In the off state, the voltage on the gate is sufficiently low such that no conduction channel is formed in the substrate, and thus no current flow occurs. In this condition, high voltage is supported between the drain and source regions.

Lateral power transistors are generally designed with source and drain regions that are elongated, or much longer than they are wide, and interdigitated. Such a device structure is disclosed in U.S. Pat. No. 6,084,277, which is assigned to the assignee of the present application. The '277 patent teaches a lateral power MOSFET or transistor having an improved gate design that provides a large safe operating area (SOA) performance level and high current capability with moderate gate speed to suppress switching noise. This is achieved by providing a metal gate electrode in parallel with the polysilicon gate structure along the length of the power MOSFET finger. The metal and polysilicon of the gate electrode and structure, respectively, are connected using metal contacts that are spaced apart along the gate structure. In one embodiment, the '277 patent teaches locating contacts at multiple locations between the gate electrode and gate structure along the power MOSFET finger to improve the propagation of the gate signal along the length of the finger for high switching speeds.

One drawback associated with the lateral power transistor structure taught by the '277 patent is high gate-to-drain capacitance due to the proximate location of the gate and drain electrodes. The drain electrode serves as a drain field plate and the gate and/or source electrodes serve as source field plates to improve the breakdown voltage of these devices. Therefore, the extent and spacing of these electrodes is determined largely by breakdown voltage requirements. For instance, the '277 patent teaches an example device capable of sustaining 700 volts between the source and drain in the off state. Accordingly, this device includes a relatively large spacing between the drain and gate or source metal lines.

But in the case where the device is designed for a much lower voltage, the closer spacing between the drain electrode and the gate electrode results in high gate-to-drain capacitance. A MOSFET designed with a breakdown voltage of 200 volts, for example, might have a spacing of less than 5 microns between the drain and gate electrode. Because these electrodes are commonly very long (e.g., 300–400 mm) the capacitance between the drain electrode and the gate or source electrode can be very large. This large capacitance degrades the high-speed switching performance of the transistor. High gate-to-drain capacitance is especially problematic because it is amplified by the gain of the transistor.

Therefore, what is needed is a high voltage power transistor structure that achieves fast switching at high current conduction levels with good propagation of gate signal. Such a device should minimize drain-to-gate capacitance without increasing overall device size or cell pitch (i.e., silicon "footprint").

BRIEF DESCRIPTION OF THE DRAWINGS

The present invention is illustrated by way of example, and not limitation, in the figures of the accompanying drawings, wherein:

FIGS. 1A–1C are three different topological views of an interdigitated lateral power MOSFET in accordance with one embodiment of the present invention.

DETAILED DESCRIPTION

A high-voltage lateral power MOSFET with reduced gate-to-drain capacitance for high switching speeds is described. In the following description, numerous specific details are set forth, such as material types, dimensions, structural features, etc., in order to provide a thorough understanding of the present invention. Practitioners having ordinary skill in the semiconductor arts will understand that the invention may be practiced without many of these details. In other instances, well-known elements, techniques, and processing steps have not been described in detail to avoid obscuring the invention.

The field effect transistor of the present invention includes a metal gate electrode coupled with an insulated gate disposed over a channel region that separates elongated source and drain regions of the power MOSFET. In one embodiment the gate comprises polysilicon, and the gate electrode is coupled to the polysilicon gate using metal contacts (also known as vias) that are located at opposite ends of a portion of the insulated gate adjacent one side of the elongated source region. The source electrode includes two segments: a wide segment that carries most of the current flowing when the device is in the on state, and a narrow segment interposed between the drain electrode and the gate electrode that greatly reduces the drain-to-gate capacitance of the device.

Figure 1B:
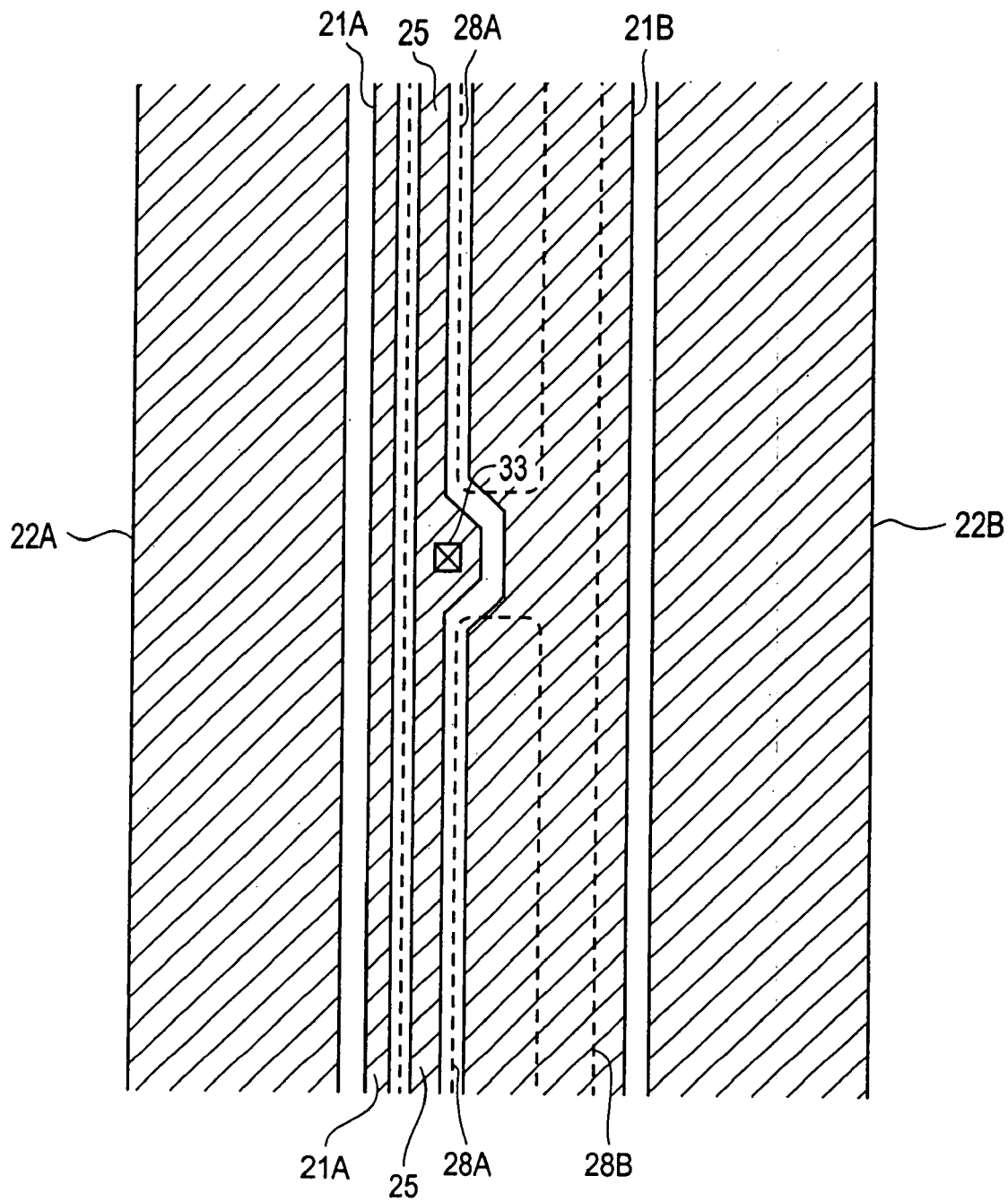
Figure 1C:
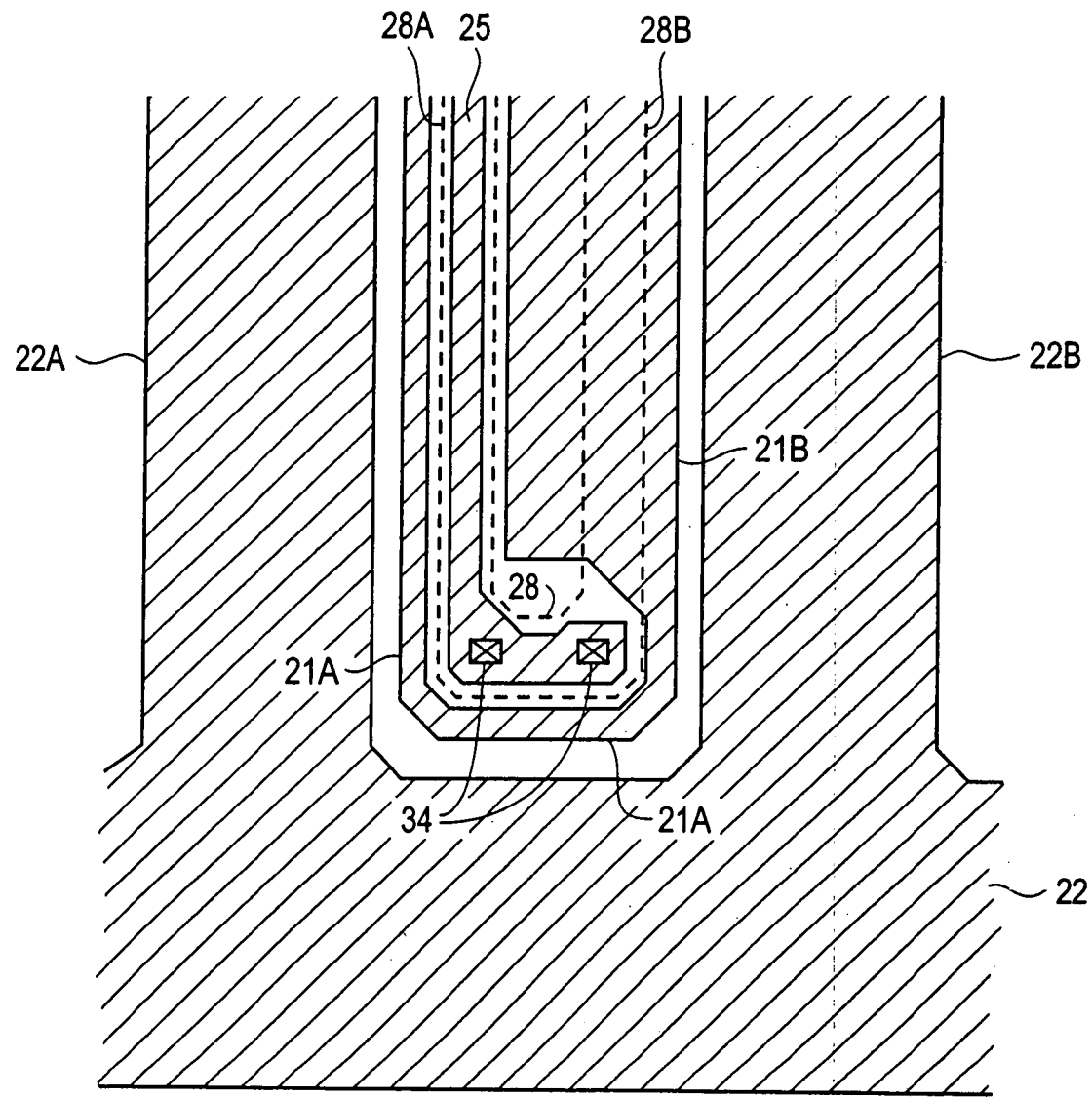

FIGS. 1A–1C are a topological view of an interdigitated lateral power MOSFET in accordance with one embodiment of the present invention. FIG. 1A provides a view of the upper portion of the device, FIG. 1B is a view of the middle portion of the device, and FIG. 1C shows the lower portion of the same transistor device. Each of these views illustrates a computer-aided design (CAD) layout of the drain, gate and source electrodes, the location of the polysilicon gate structure, and the placement of a select number of contacts or vias. It should be understood that the drain and source contacts are not shown and the underlying substrate diffusion regions are also omitted from FIGS. 1A–1C in the interest of clarity. (During the following description, FIGS. 1A–1C should be viewed together with FIG. 2, which is a side view of the transistor taken through cut lines A–A', for a more comprehensive understanding.)

FIG. 1A illustrates the layout of the upper end of one embodiment of the interdigitated lateral power device of the present invention. The field-effect transistor of FIG. 1A includes an N-type source region 44 disposed in a semiconductor substrate and connected to a source electrode 21 by contacts (not shown in FIG. 1). Source electrode 21 comprises source electrode segments 21A and 21B. Source region 44 is interposed in the semiconductor substrate between two drain regions 42, each of which is connected to a drain electrode 22 by contacts (see FIG. 2).

Both of the source electrode segments 21A & 21B are located between drain electrode segments 22A and 22B. FIG. 1C shows the segments 22A and 22B merging into a single piece of metal at the bottom of the transistor. It is appreciated that the device layout structure of FIGS. 1A–1C only shows a portion of the complete transistor in this embodiment. The full and complete device comprises a repeated pattern of the interdigitated source/drain/gate structures illustrated in the Figures. It is understood that since the drain and source structures are much longer than they are wide, they are often referred to as drain and source "fingers".

The polysilicon material 28 that comprises the gate of the transistor is depicted in FIGS. 1A–1C by dashed lines. The gate itself comprises two parallel members 28A and 28B disposed over channel region 49, extending the length of the source finger. FIG. 1C shows the polysilicon gate 28 wrapping around the far end, or fingertip, of the source region where the member 28A merges with member 28B. Members 28A and 28B many also be connected in the middle portion of the transistor, as shown in FIG. 1B.

At the upper end of the transistor, the polysilicon material of the gate extends under source electrode 21 and connects to metal line 29 through a plurality of contacts 30. Metal line 29 couples with control or switching circuitry used to drive the transistor.

Figure 2:
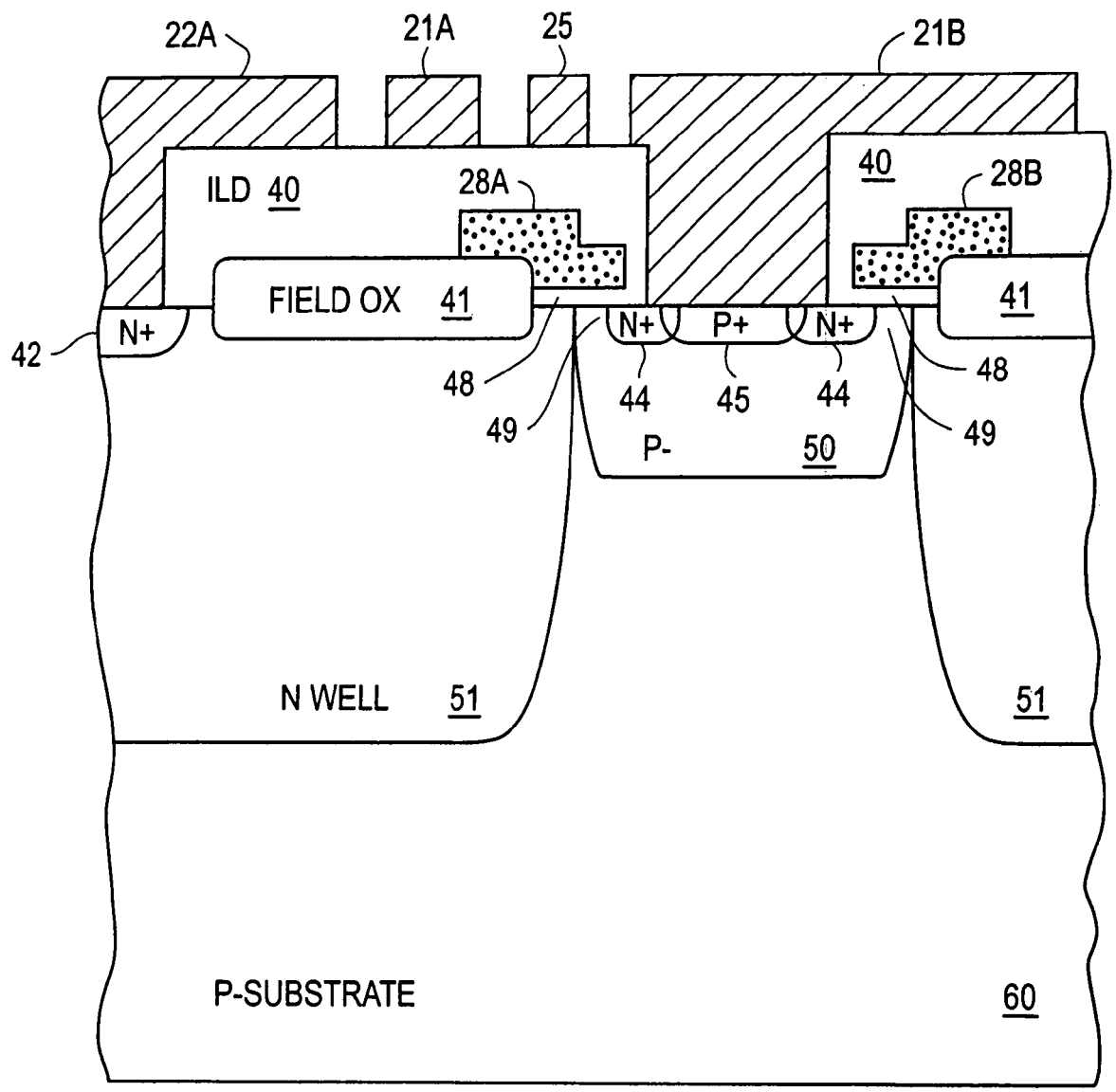
FIG. 2 is a cross-sectional side view taken through cut lines A–A' in the embodiment of FIG. 1A.

As shown in FIG. 2, the two polysilicon gate members 28A & 28B are insulated from the underlying semiconductor material by a gate dielectric layer 48. Dielectric layer may comprise silicon dioxide, but other insulating materials, such as silicon nitride, may also be used. A portion of each member 28A and 28B extends over a thicker field oxide layer 41 for field plating purposes. Each of the polysilicon gate members 28A and 28B is covered with an interlayer dielectric 40 that insulates the gate from the overlying metal gate and source electrodes, as can be seen in the cross-sectional side view of FIG. 2.

The gate electrode 25 contacts one end of the polysilicon gate adjacent the base of the source finger through contact 31, as shown in FIG. 1A. In the illustrated embodiment, gate electrode runs lengthwise from one end of gate member 28A to the opposite end adjacent the fingertip of the source region. FIG. 1C shows gate electrode 25 being connected to the opposite end of gate member 28A through a pair of contacts 34. Note that gate electrode 25 ends adjacent the fingertip of the source and does not extend over gate member 28B, which runs alongside the opposite side of source region 44.

It is appreciated that the connection of gate electrode 25 in parallel with insulated gate member 28A advantageously distributes the applied gate signal along the length of each finger for improved high switching speed performance. Depending on the length of the source, drain, and gate fingers, one or more additional contacts may be located at intermediate points or regions of the insulated gate between the opposite ends of the finger. For example, FIG. 1B illustrates an optional additional contact 33 connecting gate electrode 25 to gate member 28A at an intermediate point approximately halfway between the two ends of gate member 28A. Gate member 28B may also be connected to gate member 28A in proximity to contact 33 to provide the same advantage in distribution of the gate signal along member 28B.

To accommodate the placement of contact 33 the width of the gate electrode 25 metal is made slightly wider to adequately surround contact 33. To maintain design rule separation between the source and gate electrodes, source electrode segment 21B is made slightly narrower by a corresponding dimension. Note that no change in the width of source electrode segment 21A (or drain electrodes 22A & 22B) is needed to accommodate the placement of additional contact 33.

The gate electrode 25 is completely surrounded by source electrode 21. The wider, current-carrying portion of the source electrode is denoted as source electrode segment 21B in FIGS. 1A–1C. Segment 21B carries the vast majority of the source current to the source bond pads (not shown) located at the upper end of the source finger. The source electrode segment 21B also includes a laterally extended portion that overlaps gate member 28B. This laterally extended portion is located on the side of the finger opposite gate electrode 25 and functions as a field plate. The main source electrode segment 21B is disposed substantially over and contacts the substrate source region 44.

The narrower portion of the source electrode is denoted as source electrode segment 21A in FIGS. 1A–1C. Source electrode segment 21A is interposed between gate electrode 25 and drain electrode 22A. In the embodiment of FIGS. 1A–1C, source electrode segment 21A has no contacts to the underlying source diffusion, and does not carry a significant amount of source current. It functions as a source field plate and also reduces the drain-to-gate capacitance of the transistor. It should be understood that in other embodiments, source electrode segment 21A may include contacts to the source diffusion region and/or may carry more significant amounts of source current.

In addition, although each of the source, drain, and gate electrodes are shown in FIGS. 1 & 2 as comprising a single layer of metal, alternative embodiments may utilize multiple levels of conductor material for each or all of the electrodes.

FIG. 1C illustrates source electrode segment 21A wrapped around the source fingertip region of the transistor and connected to source electrode segment 21B. It should be understood that the connection between segments 21A and 21B at this end of the source finger is optional. That is, these two segments need not connect at this point. However, source electrode segment 21A should be connected to segment 21B at some point in the layout so that both remain at substantially the same potential during device operation. This is consistent with the purpose of source segment 21A to serve as a source field plate interposed between the gate electrode 25 and the drain electrode 22.

FIG. 2 shows a cross-sectional view of the lateral power transistor of FIGS. 1A–1C taken through cut lines A–A'. This diagram shows that drain electrode 22A extends down through interlayer dielectric 40 to contact N+ drain region 42. Drain electrode 22A also includes a field plate portion that extends laterally over interlayer dielectric 40 toward the source electrode segment 21A. In the illustrated embodiment, the distance between the drain electrode 22A and the source electrode segment 21A is the same as the distance (e.g., 3 microns) between the gate electrode 25 and source electrode segment 21A. The same distance separates the gate electrode 25 from the source electrode segment 21B, which extends down to the surface of the substrate to contact N-type source region 44 and P+ diffusion region 45. This spacing is consistent with minimum design rules for an exemplary lateral power transistor having a 200V breakdown voltage.

Drain diffusion region 42 is disposed in N-well region 51, which itself is a deep diffusion formed in P-substrate 60. Source diffusion region 44 is disposed in a P-well 50 formed adjacent to N-well 51 in substrate 60. The channel region 49 is defined between the boundaries of the N-well region 51 and source region 44. The polysilicon gate members 28A and 28B are formed over a thin gate oxide 48 above channel region 49. Note that each of gate members 28A and 28B include field plating that extends over thicker field oxide layer 41. The region between N+ drain region 42 and channel 49 is commonly referred to as the extended drain region of the device.

It is appreciated that the foregoing details of the various regions formed in the semiconductor material beneath the top surface of the substrate are specific to the embodiment shown and are not deemed essential to the present invention. In other words, the layout structure of the metal electrodes and gate members may be utilized in transistors having different doped semiconductor regions of the device.

I claim:

1. A lateral field-effect transistor comprising:

interdigitated source and drain region fingers, a source region finger being separated from a first drain region finger on a first side by a first channel region and from a second drain region finger on a second side by a second channel region;

a first gate member disposed over the first channel region and a second gate member disposed over the second channel region, the first and second gate members being substantially parallel;

a drain electrode extending substantially over, and coupled with, the first and second drain region fingers;

a gate electrode extending substantially over, and coupled with, the first gate member, the gate electrode and the drain electrode being disposed in a general plane;

a source electrode that includes first and second source electrode segments each being coupled to the source region finger and each having first and second ends, the first end of the first source electrode segment being merged with the first end of the second source electrode segment, the second end of the first source electrode segment being merged with the second end of the second source electrode segment, the first source electrode segment being disposed substantially over the source region finger and including a laterally extended portion that substantially overlaps the second gate member, the gate electrode being laterally surrounded by the first and second source electrode segments, with the first source electrode segment being adjacent a first lateral side of the gate electrode and the second source electrode segment being adjacent a second lateral side of the gate electrode; and wherein a majority of a source current flows in the first source electrode segment, and a minority of the source current flows in the second source electrode segment, when the lateral field-effect transistor is in an on-state.

2. The lateral field-effect transistor according to claim 1 wherein the first and second gate members are connected by a bridging member.

3. A field-effect transistor comprising:

a substrate;

source and drain regions disposed in the substrate;

a gate disposed over a region of the substrate between the source and drain regions;

a drain electrode disposed substantially over, and coupled with, the drain region;

a gate electrode having first and second lateral sides disposed substantially over, and coupled with, the gate, the gate electrode and the drain electrode being disposed in a general plane;

a source electrode having first and second source electrode segments each having first and second ends, the first end of the first source electrode segment being merged with the first end of the second source electrode segment, the second end of the first source electrode segment being merged with the second end of the second source electrode segment, the first and second source electrode segments being electrically connected to the source region, the first source electrode segment being interposed between the drain electrode and a first lateral side of the gate electrode in the general plane, the second source electrode segment being disposed substantially over the source region and having a first side adjacent the second lateral side of the gate electrode, wherein a majority of a source current flows in the second source electrode segment, and a minority of the source current flows in the first source electrode segment, when the lateral field-effect transistor is in an on-state.

4. The field-effect transistor according to claim 3 wherein the gate comprises first and second gate members, the gate electrode being disposed substantially over the first gate member.

5. The field-effect transistor according to claim 4 wherein the second source electrode segment includes a field plate portion that laterally extends substantially over the second gate member.

6. The field-effect transistor according to claim 4 wherein the source electrode surrounds the gate electrode in the general plane.

7. The field-effect transistor according to claim 4 wherein the second source electrode segment is substantially wider than the first source electrode segment.

8. The field-effect transistor according to claim 3 wherein the source and drain regions are arranged in an interdigitated manner.

9. The field-effect transistor according to claim 3 wherein the drain electrode includes a field plate portion.

10. A lateral field-effect transistor comprising:

a substrate;

source and drain regions disposed in the substrate;

a first gate member disposed over a first region of the substrate between the source and drain regions, and a second gate member disposed over a second region of the substrate between the source and drain regions, the first and second gate members being substantially parallel and being connected by at least one bridging member;

a drain electrode extending substantially over the drain region, the drain electrode being electrically connected to the drain region;

a gate electrode extending substantially over the first gate member, the gate electrode being electrically connected to the first and second gate members; and a source electrode that includes first and second source electrode segments each having first and second ends, the first end of the first source electrode segment being merged with the first end of the second source electrode segment, the second end of the first source electrode segment being merged with the second end of the second source electrode segment, the first and second source electrode segments being coupled to the source region, the first source electrode segment being disposed substantially over the source region and having a field plate that extends over the second gate member, the gate electrode being laterally surrounded by the first and second source electrode segments, with the first source electrode segment being adjacent a first lateral side of the gate electrode and the second source electrode segment being disposed between a second lateral side of the gate electrode and the drain electrode.

11. The lateral field-effect transistor according to claim 10 wherein a majority of a source current flows in the first source electrode segment, and a minority of the source current flows in the second source electrode segment, when the lateral field-effect transistor is in an on-state.

12. The lateral field-effect transistor according to claim 10 wherein the second source electrode segment and the gate electrode are disposed in a general plane.

13. The lateral field-effect transistor according to claim 10 wherein the source and drain regions are arranged in an interdigitated manner.

* * * * *

UNITED STATES PATENT AND TRADEMARK OFFICE
CERTIFICATE OF CORRECTION

| | | |
|---|---|---|
| PATENT NO. | : 7,115,958 B2 | Page 1 of 1 |
| APPLICATION NO. | : 10/968659 | |
| DATED | : October 3, 2006 | |
| INVENTOR(S) | : Disney et al. | |

It is certified that error appears in the above-identified patent and that said Letters Patent is hereby corrected as shown below:

On the Title page of the patent, after the Prior Publication Data section, insert:

Item -- (63) Related U.S. Application Data
Continuation of application No. 10/340,040, filed on Jan. 10, 2004, Pat. No. 6,825,536, which is a continuation of application No. 10/016,748, filed on Oct. 29, 2001, Pat. No. 6,555,883. --

In the Specification of the patent, column 1, before the FIELD OF THE INVENTION section, insert:

-- This application is a continuation of Ser. No. 10/340,040, filed on Jan. 10, 2004, Pat. No. 6,825,536, which is a continuation of application Ser. No. 10/016,748, filed on Oct. 29, 2001, Pat. No. 6,555,883. --

Signed and Sealed this
Eighth Day of October, 2013

Teresa Stanek Rea
*Deputy Director of the United States Patent and Trademark Office*